(12) United States Patent
Kasai et al.

(10) Patent No.: US 7,791,023 B2
(45) Date of Patent: Sep. 7, 2010

(54) ELECTRON HOLOGRAPHY SYSTEM

(75) Inventors: Hiroto Kasai, Higashimatsuyama (JP); Yutaka Kaneko, Mitaka (JP)

(73) Assignee: Hitachi, Ltd., Tokyo (JP)

( * ) Notice: Subject to any disclaimer, the term of this patent is extended or adjusted under 35 U.S.C. 154(b) by 337 days.

(21) Appl. No.: 11/746,096

(22) Filed: May 9, 2007

(65) Prior Publication Data
US 2008/0067375 A1 Mar. 20, 2008

(30) Foreign Application Priority Data
Jun. 12, 2006 (JP) .............................. 2006-161783

(51) Int. Cl.
G01N 23/00 (2006.01)
G21K 7/00 (2006.01)
(52) U.S. Cl. ...................................................... 250/311
(58) Field of Classification Search ................ 250/306, 250/307, 310, 311
See application file for complete search history.

(56) References Cited

U.S. PATENT DOCUMENTS

| | | | | |
|---|---|---|---|---|
| 4,009,940 A * | 3/1977 | Ohzu | .......................... | 359/578 |
| 5,811,806 A * | 9/1998 | Honda et al. | ................. | 250/311 |
| 6,252,339 B1 * | 6/2001 | Kendall | ...................... | 313/237 |
| 6,791,095 B2 * | 9/2004 | Pan et al. | ................ | 250/442.11 |
| 2003/0160969 A1 * | 8/2003 | Endo et al. | ................... | 356/520 |
| 2003/0178576 A1 * | 9/2003 | Pan et al. | ................ | 250/442.11 |
| 2004/0140436 A1 * | 7/2004 | Kikuchi | ................. | 250/442.11 |
| 2004/0213133 A1 * | 10/2004 | Funato et al. | .......... | 369/112.07 |
| 2005/0253066 A1 * | 11/2005 | Watanabe et al. | ........... | 250/310 |
| 2008/0258058 A1 * | 10/2008 | Harada et al. | ............... | 250/310 |
| 2009/0273789 A1 * | 11/2009 | Harada et al. | ........... | 250/396 R |

FOREIGN PATENT DOCUMENTS

JP 04-014744 1/1992
JP 2005-197165 7/2005

* cited by examiner

Primary Examiner—Jack I Berman
Assistant Examiner—Brooke Purinton
(74) Attorney, Agent, or Firm—Antonelli, Terry, Stout & Kraus, LLP.

(57) ABSTRACT

In electron holography observation using a transmission electron microscope, searching of conditions of an electron optical condition which are necessary for realizing a requested spatial resolution is sophisticated and for persons unaccustomed to operation of the electron microscope, the observation is time consuming work. In addition to the fundamental electron microscope proper, an input unit for inputting a spatial resolution requested in the holography observation, a calculation unit for calculating positions of electron biprism and specimen necessary for realizing the requested spatial resolution from the inputted value and parameters characteristic of the device and mechanisms for moving the two positions for realizing the obtained calculation results are provided.

11 Claims, 9 Drawing Sheets

ELECTRON HOLOGRAPHY SYSTEM

INCORPORATION BY REFERENCE

The present application claims priority from Japanese application JP2006-161783 filed on Jun. 12, 2006, the content of which is hereby incorporated by reference into this application.

BACKGROUND OF THE INVENTION

The present invention relates to devices for observing an image of a specimen by using a charged particle beam and an observation method using with them and more particularly, to a means for making a optimum optical condition for observation more easier in electron holography method than in a conventional one.

The electron holography method is one of specimen observation methods by an electron microscope. The electron holography method is an observation method utilizing the nature of electrons behaving as a wave, according to which an electron beam having transmitted through a substance (object wave) is interfered with an electron beam unaffected by the substance (reference wave) to obtain an interference fringe and phase information of the electron beam is extracted from the thus obtained interference fringe. Originally, the disclosed electron holography method was contrived as a means for correcting a spherical aberration of an electron lens constituting an electron microscope but nowadays, its application range expands even to observation of a local electromagnetic field and observation of a biological specimen such as protein as well. For example, Japanese Patent Application No. 02-117544 (Corresponding to JP-A-4-14744) is available as Patent Document disclosing a general apparatus construction and the principle of image formation for realizing the electron holography.

In spite of the fact that the electron holography is known as a useful analysis method, it is practiced almost in laboratories at present and cannot be said to be materialized in the form of a device widely used as analysis appliance for practical purposes. One major reason for this is that setting of an electron optical system is complex and has a low degree of usability. To describe more specifically, the use purpose of the device quite differs depending on device users and hence conditions of wide range having difficulties in generalization must be covered, bottlenecking automation of the electron optical condition setting and besides, most of device users are skilled persons such as researchers who are prone to customize the device from the viewpoint of hardware and software and so manual operation meets user's needs rather than relying on low-grade automation.

Conventionally, adjustment of the electron optical condition in the holography electron method is carried out in accordance with the following two procedures:

(1) Deflection angle θ of an electron beam biprism is adjusted.

(2) Focal length f of an objective lens is adjusted.

Accordingly, a typical flow of adjustment of the electron optical condition in the conventional electron holography method will be described hereunder.

Conventionally, for adjustment of the electron optical system of a holography microscope, operation or work (a series of operations of searching conditions for electron holography observation) are needed as shown in a flowchart of FIG. 1. Firstly, a specimen to be observed is inserted to an electron microscope in step 81 and thereafter, in step 82, an interference fringe spacing (Δx) and an interference area (w) which satisfy a requested spatial resolution (d) are estimated. Especially when a Fourier transform method is used as a method for reconstruction of a hologram, it is important that for the sake of obtaining a desired spatial resolution, work must proceed by taking care of the necessity for the interference fringe spacing to be about ⅓ of the resolution.

In the first step of adjustment, the deflection angle θ the electron biprism provides is adjusted. In this step, for adjustment of θ, the electrical voltage to be applied to a glass fiber (biprism voltage; Vp) and relative polarity between the glass fiber and ground potential are adjusted. Ground electrodes are disposed at the opposite ends of the fiber and specifically, the polarity relative to the ground electrode is adjusted. The deflection angle θ increases in proportion to the voltage applied to the glass fiber, having an upper limit at which the interference area reaches a maximum interference area ($w_{max}$).

In branching step 83 in FIG. 1, it is decided whether Δx can be realized by adjusting $V_p$ only. If "Yes" is determined in this step, a set Vp is applied as it is (step 84) and the program proceeds to branching step 85 in which it is decided whether an area w with a fringe spacing Δx is so wide as to accord with a requested width. If "No" in the branching step 83 or 85, exciting currents to the objective lens 5 and an intermediate lens 8 (see FIG. 2) are adjusted and an image plane or an object plane of the objective lens is moved to satisfy a requested observation condition (step 86). Through execution of a search operation in the steps 83 through 86, the image plane and focal length of the objective lens can be changed while keeping the biprism voltage Vp to the set value (step 87) and as a result, the electron optical condition can be adjusted so as to be placed in condition satisfying the desired Δx and w.

On the other hand, JP-A-2005-197165 discloses an invention according to which two electron biprisms are used to make Δx and w adjustable independently.

In order to realize a wide condition range through the method as shown in FIG. 1, the intermediate lens current needs to be adjusted highly accurately within a very narrow range. In the case of a general electron microscope, lens currents of the intermediate lens and other lenses are often preset by makers and changing to arbitrary values in the course of ordinary observation is unexpected. Therefore, in many cases, adjustment of the amounts of intermediate lens current is difficult to execute on the user side and even if an adjustment of the current amount has been done, a fine change amount adjustment is often impossible in effect. This will be detailed below.

Illustrated in FIG. 2 is a typified example of an electron optical system for electron holography observation. The electron optical system shown in FIG. 2 corresponds to that when a transmission electron microscope is used. In FIG. 2, an incident electron beam 1 irradiating a specimen 3 includes irregularity of incident angle 2 (hereinafter, this angle irregularity is termed a divergence angle). An electron beam having transmitted through the specimen passes through the objective lens 5 to form an image at the position of an objective lens imaging plane 7. During holography observation, an electron biprism 6 comprised of a ground electrode and a metal coated glass fiber of about 0.3 μm diameter is located behind the objective lens 5 and electrical potential is applied to the glass fiber. In the case of FIG. 2, by applying a negative potential, electron beam components on the right and left sides of the electron biprism 6 are deflected by an angle 11 (defection angle θ) to go away from the optical axis. As a result, the right and left electron beam components resulting from splitting the electron beam by means of the electron biprism 6 are superimposed on each other on the image plane 7 of objective lens, causing an interference fringe in an area 9. This interference fringe is called a hologram and a width of hologram area 9, when converted into a size on a specimen plane 4, has a value 10 which in turn is called an interference area w.

The interference area w can be expressed by the following equation (1) under the condition that the objective lens image plane and wavelength λ of the incident electron beam are constant. In equation (1), the second term on right side corresponds to a shading portion shielded by the electron biprism.

$$w = \frac{2 \cdot \theta(b-l)}{M_{obj.}} - 2r_f \cdot \frac{f}{f-l} \quad (1)$$

where θ represents an angle deflected by the electron biprism, l a distance between the objective lens and the electron biprism, b a distance between the objective lens and the image plane, $M_{obj}$ a magnification of the objective lens, $r_f$ a radius of the fiber of electron biprism and f a focal length of the objective lens.

Also, the value of interference fringe spacing Δx can be expressed by the following equation (2):

$$\Delta x = \frac{1}{M_{obj.}} \cdot \frac{\lambda(b-f)}{2 \cdot \theta|l-f|} = \frac{f \cdot \lambda}{2 \cdot \theta|l-f|} \quad (2)$$

where f represents the focal length of objective lens, λ the wavelength of incident electron beam, θ the angle deflected by the electron biprism and l the distance between objective lens and electron biprism. Maximum value $w_{max}$ of the area w is determined by the wavelength λ of incident electron beam and the divergence angle β. Even if superimposition by the electron biprism is effected over an area in excess of $w_{max}$ to increase the interference area, the interference fringe cannot be obtained. As will be seen from equations (1) and (2), the interference fringe spacing, interference area and biprism voltage are so related to one another as to be determined uniformly if any one of them is set unless another parameter is changed. Therefore, the conventional device fails to realize enlargement or narrowness of the interference fringe spacing while keeping an interference area increased in excess of a constant limit.

When changing various parameters appearing in equations (1) and (2), the device user is requested to operate the device by using arbitrary values deviating from the condition set by the maker and is urged to operate in a very special environment. Accordingly, a highly graded technical level is required for adjustment and persons other than operators very skilled in electron microscope operation are forced to confront extremely sophisticated work.

SUMMARY OF THE INVENTION

In the light of the above problems, the present invention has for its object to provide realization of easy-to-handle holography observation for enabling a wide range of persons from beginners to skilled persons to operate an electron microscope in the course of holography observation.

In an electron microscope capable of performing holography observation, a mechanism for up-down moving one of a specimen position and an electron biprism position or both in at least the optical axis direction is provided and an information processing unit having the function to automatically calculate the amount of movement is also provided. Further, the information processing unit has the function to examine whether the specimen position or the electron biprism position after movement has a proper value to realize a spatial resolution or an interference area size an device user desires, thus alleviating a load imposed on the device user during adjustment for observation.

According to the present invention, upon conducting holography observation with the electron microscope, positions of electron biprism and specimen necessary to realize a requested spatial resolution or interference area are determined by a calculation unit and besides, the electron biprism and specimen positions are moved toward the respective calculated position targets. In this process, the condition for holography observation can be set semi-automatically. Consequently, the time required for searching the observation condition, listed as the problematic issue encountered in the holography observation with the conventional electron microscope, can be reduced.

Other objects, features and advantages of the invention will become apparent from the following description of the embodiments of the invention taken in conjunction with the accompanying drawings.

DESCRIPTION OF THE INVENTION

Embodiment 1

In the present embodiment, an example will be described in which a holography electron method of the present invention is applied to a transmission electron microscope (TEM).

Figure 1:
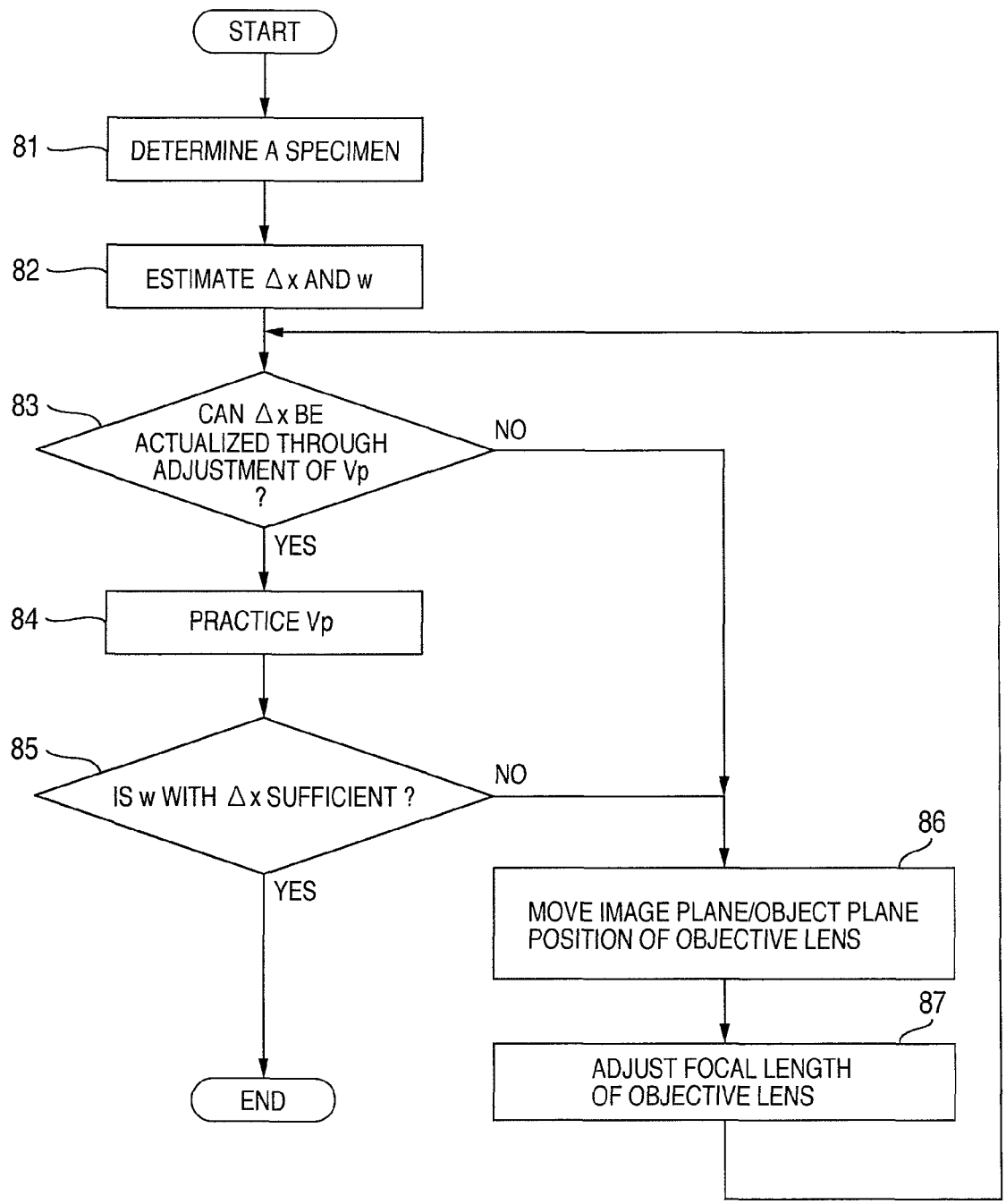
FIG. 1 is a flowchart of conventional work of searching conditions for holography observation.
Figure 2:
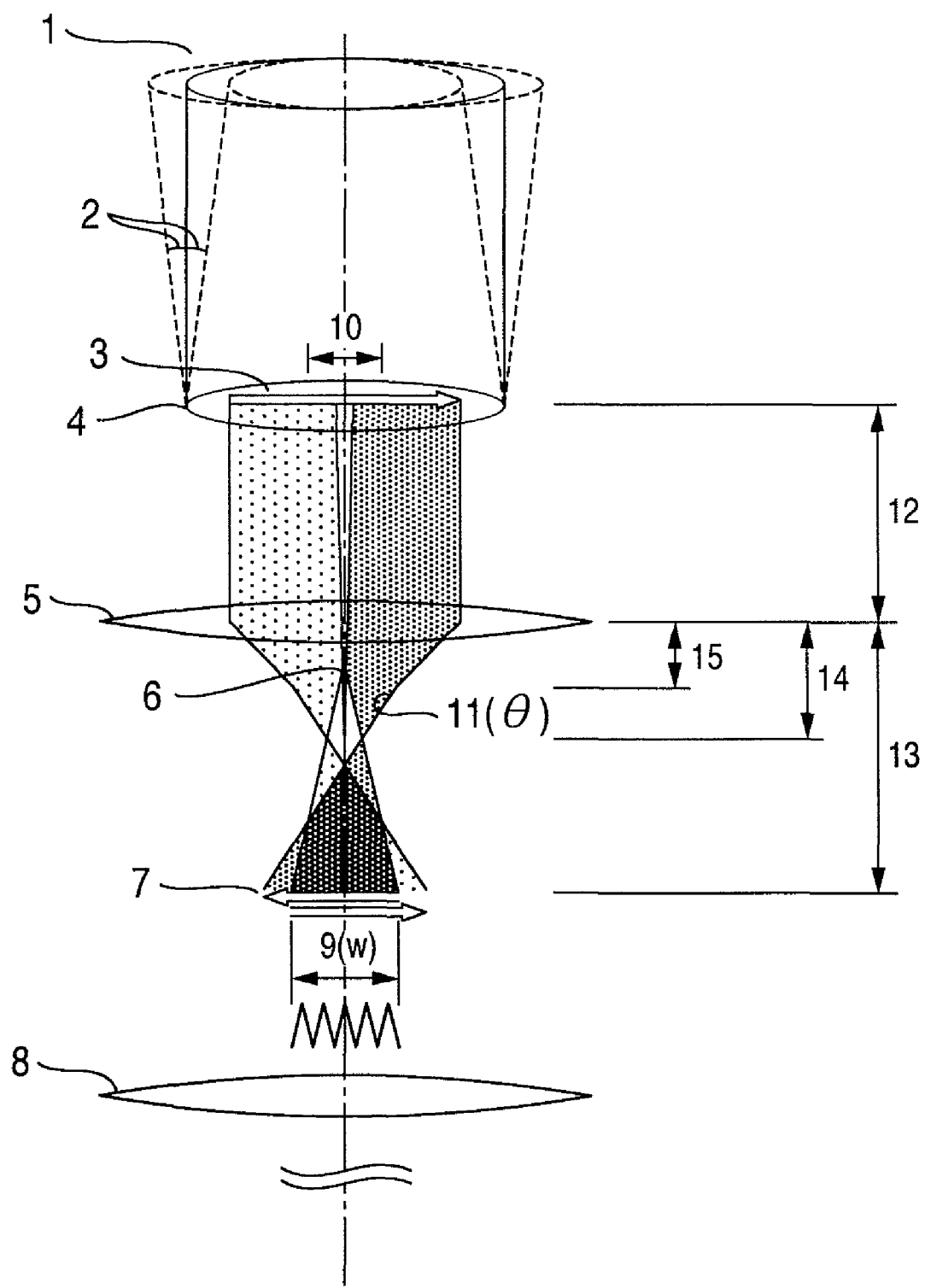
FIG. 2 is a schematic diagram showing an electron optical condition of transmission electron microscope for holography observation.
Figure 3:
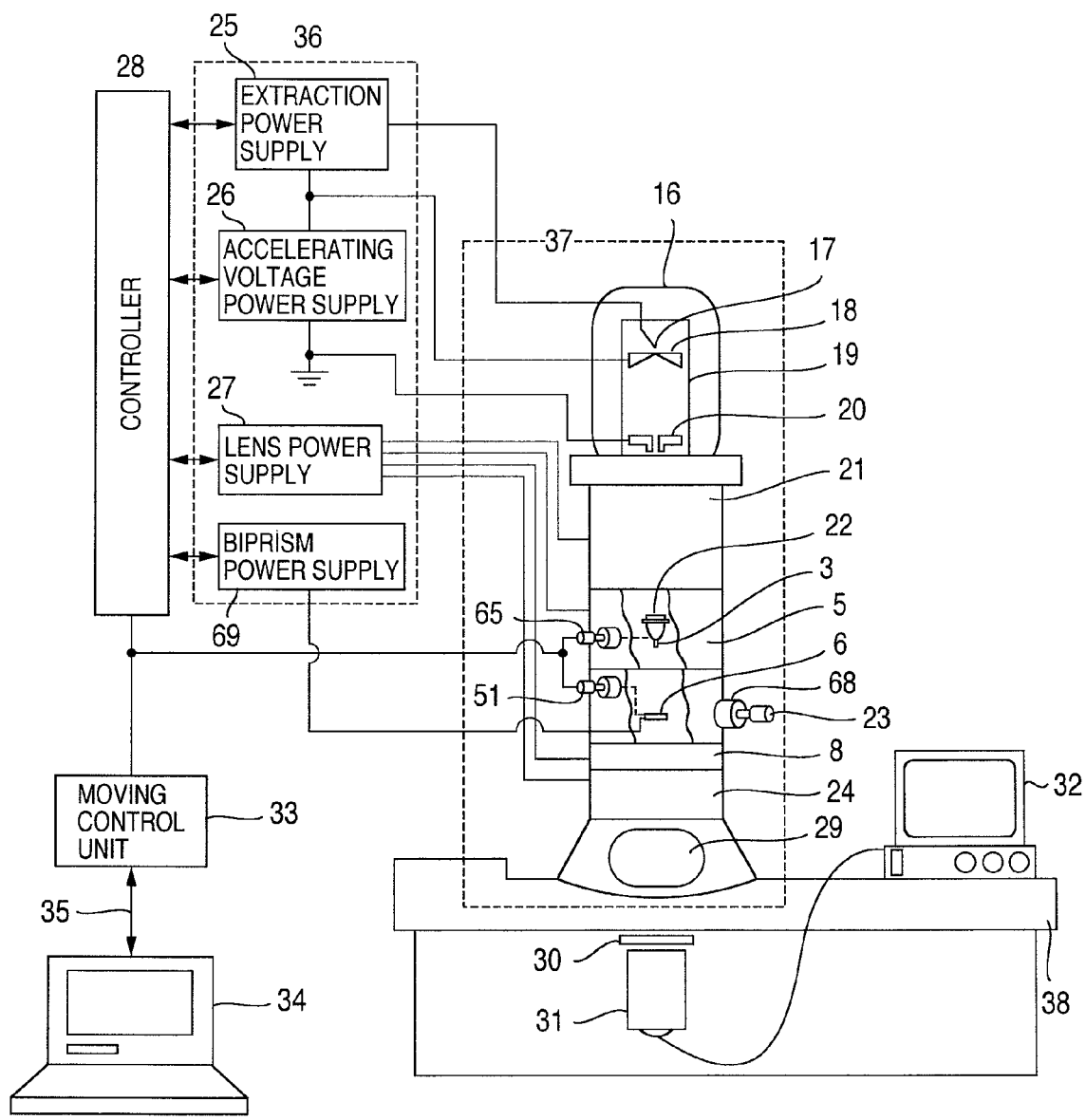
FIG. 3 is a device external view of a transmission electron microscope (TEM) to which the present invention is applied.

The transmission electron microscope in the present embodiment is externally configured as schematically illustrated in FIG. 3. The transmission electron microscope shown in FIG. 3 generally comprises an electron microscope column 37, a stand 38 on which the electron microscope column 37 is mounted, a power supply unit 36 for supplying voltage or current to individual components of the electron microscope column 37, a television monitor 32 for displaying picked-up TEM images and a controller 28 for controlling the power supply unit 36.

The electron microscope column 37 includes an electron gun 16 and underlying illuminating optical system and image forming optical system. The electron gun 16 is comprised of an electron source 17 formed from stylus tungsten single crystal having a sharpened fore end, an extraction electrode 18 and a ground electrode 20 which are positioned to oppose the electron source 17 and an accelerating tube 19 for accelerating extracted electrons. The extraction electrode 18 can be applied with high voltage by means of an externally arranged extraction power supply 25 in order that a voltage of about −3.0 to −2.5 kV can be applied across electrode 18 and electron source 17 to extract electrons.

The accelerating voltage for accelerating the extracted electrons is supplied to the accelerating tube 19 from an accelerating voltage power supply 26 included in the power supply unit 36.

The illuminating optical system includes an illuminating lens 21 for setting an electron beam emitted from the electron gun 16 to a desired illumination condition. The electron beam having passed through the illuminating optical system irradiates a specimen 3 mounted to the fore end of a specimen holder 22. Although not illustrated, a specimen holder moving mechanism is arranged around the specimen holder 22. This will be detailed later with reference to FIG. 6.

Arranged under the specimen holder 22 are an objective lens 5, a biprism 6 for splitting the transmission electron beam and a biprism moving mechanism. The biprism 6 is supplied with electric potential from a biprism power supply 69 arranged externally. The biprism moving mechanism is disposed inside the electron microscope column 37 and adapted to move the height of the biprism and rotate it on XY plane by amounts desired by the operator, respectively. Reference numeral 23 in FIG. 3 generally designates a wire holder transport mechanism including components 53 to 55 (see FIG. 4) to constitute the biprism moving mechanism. Designated by reference numeral 68 is an evacuation chamber for preliminary evacuating part of the biprism 6 and wire holder transport mechanism 23 when they are brought into the column. The specimen holder moving mechanism and the biprism moving mechanism are connected together by a moving control unit 33 and the moving control unit 33 consults results of calculation by the information processing unit 34 to move the electron biprism 6 and specimen holder 22 to determined positions, respectively. The biprism 6 and biprism moving mechanism will be detailed later with reference to FIG. 4.

Arranged under the biprism 6 is the image forming optical condition including an intermediate lens 8 and projection lenses 24 which succeed the objective lens 5. The electron beam having transmitted through the specimen 3 passes through the objective lens 5 to form an image on the objective lens imaging plane, which formed image is further enlarged by means of the intermediate lens 8 and projection lenses 24. Exciting currents are supplied to the objective lens 5, intermediate lens 8 and projection lenses 24 from a lens power supply 27 arranged in the power supply unit 36. The lens power supply 27 is also connected to the controller 28 to enable it to interpret a command signal from the operator so as to constantly control the output of the lens power supply 27.

Accommodated in the stand 38 are a photo film 30 for recording an image enlarged by the optical condition and a television camera 31 for getting the image. The thus obtained enlarged image is observed by the operator directly through a viewing port 29 or by way of the television monitor 32.

The information processing unit 34 in the present embodiment includes an input device for inputting control parameters necessary for control of positions of the biprism 6 and specimen holder 22, such as for example, values of interference area w and spatial resolution d. The information processing unit 34 also includes a storage means for storing information necessary for observation condition search or operation control of the electron microscope, for example, a memory or various storage devices. Enumerated as the information to be stored in the storage means are, for example, accelerating voltage for the incident electron beam, focal length of the objective lens, divergence angle of the electron beam incident on the specimen (this value can also be calculated from a illuminating beam current or excitation current of condenser lens), distance between the objective lens and the specimen position, distance between the objective lens and the imaging plane, distance between the objective lens and the intermediate lens, distance between the objective lens and the electron biprism, deflection angle per unit voltage at the electron biprism, and diameter of a glass fiber constituting the electron biprism. Further, the storage means is stored with software for execution of the observation condition search or operation control and the software is executed by an operation means provided for the information processing unit 34. The aforementioned various kinds of information and software may not always be stored in the same storage means.

On the basis of the result of calculation by the information processing unit 34, the moving control unit 33 transmits command signals 35 complying with moving amounts of specimen holder 22 and electron biprism 6 to the specimen holder moving mechanism and the biprism moving mechanism, respectively. The electron biprism 6 can be not only moved in the optical axis direction but also rotated through arbitrary angles in a plane orthogonal to the optical axis. Preferably, the movable range of each of the specimen holder 22 and electron biprism 6 is wide but in the practical device, it needs to avoid interference with the overall height of device and the fundamental equipments of electron microscope (such as lens, alignment coil and aperture). For example, in the case of an electron microscope having an accelerating voltage of 200 kV class, the moving range is required to fall into a range of approximate 20 to 30 mm.

Further, in the device shown in FIG. 3, in preparation for the necessity of fine adjustments of the respective positions after having the execution of biprism moving amount (Δl) and specimen holder moving amount (Δa) conducted, the information processing unit 34 is provided with the function to input a command signal for fine movement execution, thereby ensuring that fine movements of the respective moving mechanisms can be materialized by transmitting the command signals to the moving control unit 33.

Figure 4:
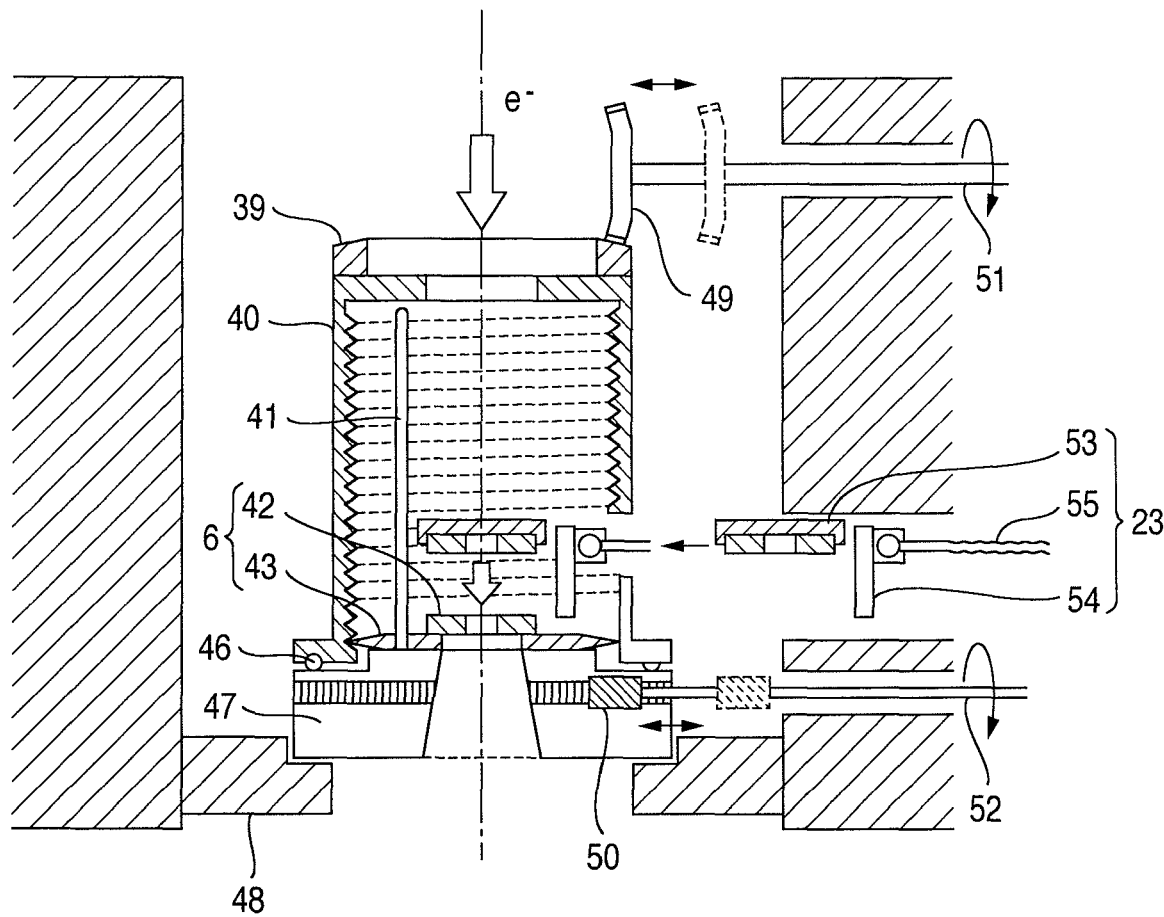
FIG. 4 is a schematic diagram showing in sectional form a biprism moving mechanism.

Referring to FIG. 4, details of the biprism moving mechanism arranged in the electron microscope column 37 will be described. The biprism moving mechanism includes a cylinder having its inner wall threaded with a female screw (biprism elevator 40) and its top and bottom surfaces bored to form holes for transmission of the electron beam. The top of biprism elevator 40 is mounted with an annular gear 39 adapted to rotate the whole of the biprism elevator 40. While in the present embodiment the rotary mechanism based on screw is provided for the purpose of vertically moving the biprism, the mechanism for vertically driving the biprism may be materialized with a means other than the rotary mechanism.

The gear 39 is so arranged as to mesh with a bevel gear 49 attached to the fore end of a shaft of a rotation feed through 51 for biprism elevator. The biprism elevator rotation feed through 51 is connected to a motor for its drive (not shown) arranged externally of the electron microscope column 37 with a first feed through which attached the electron microscope column 37. The number of revolutions of the drive motor is controlled by the moving control unit 33, so that the drive motor can be rotated by a number of revolutions the operator desires to thereby execute a height adjustment of the biprism. Details of the control will be described later. The electron biprism 6 in the present embodiment is comprised of two kinds of parts of wire holder 42 and wire holder mount 43, having a wire for separating or splitting the optical path of transmission electron beam fixedly mounted to the wire holder 42. The structure separating the electron biprism into the portion for holding the wire and the other portion has an advantage makes easy replace old wire with a new one. It is to be noted that the wire holder 42 is constructed of a wire base 44 and a biprism ground electrode 45 as will be detailed hereinafter with reference to FIG. 5.

Since wires held by the wire holder 42 are expendable supplies, there needs an exchange mechanism. In addition, the biprism is unnecessary during ordinary image observation except for the electron holography observation and hence, in the side wall of biprism elevator 40, an opening is formed which is used to place the wire holder 42 on a biprism rotary stage 47 or to retreat it therefrom. Similarly, in the side wall of electron microscope column 37, a second feed through is formed. The wire holder transport mechanism 23 can transport the wire holder 42 to the outside of the column by way of the second feed through and the opening formed in the biprism elevator 40 without impairing the vacuum condition inside the column. Although not illustrated in FIG. 4, a biprism pre-evacuation chamber 68 (FIG. 3) for evacuation or retreat of the biprism is disposed externally of the second feed through and before exchanging the biprism into the column, this chamber is precedently evacuated to vacuum. Then, a vacuum valve is disposed at a junction between the biprism pre-evacuation chamber 68 and the electron microscope column 37. After the biprism pre-evacuation chamber 68 and the column have been evacuated to substantially the same vacuum pressure, the wire holder transport mechanism 23 is advanced while the wire holder 42 being held by a chuck 53 to transport the wire holder into the biprism elevator. By lowering the chuck 53 to the lower end of a guide frame 54, the transported wire holder 42 is fixed on the wire holder mount 43 seated on the biprism rotary stage 47 which is supported by a stage base 48. The structure of chuck 53 and guide frame 54 will be described by making reference to FIG. 5. The rim of wire holder mount 43 is threaded with a male screw which is brought into engagement with the female screw threaded in the inner wall of the biprism elevator 40.

Further, the rim of biprism rotary stage 47 is formed with a geared strip area which is in mesh engagement with a worm gear 50 attached to the fore end of a shaft of biprism rotary stage rotation feed through 52. The biprism rotary stage rotation feed through 52 leads to the outside of the vacuum column by way of a third feed through formed in the electron microscope column 37 and is rotated by a drive means (for example, motor) arranged externally of the electron microscope column 37.

Structurally, a bearing 46 is interposed between the biprism rotary stage 47 and the biprism elevator 40 in order that these respective components can rotate independently. With the biprism elevator rotation feed through 51 and biprism rotary stage rotation feed through 52, the moving displacement amount in the optical axis direction and the rotation angle, both from their initial conditions, can be measured on the basis of a unit rotation angle or a unit rotary shift amount. By utilizing this, information concerning the relation between the unit rotation angle of the biprism elevator rotation feed through 51 and the moving amount in the optical direction the holder mount 43 exhibits and information concerning the relation between the unit rotation angle of the biprism rotary stage rotation feed through 52 and the rotation angle the biprism rotary stage 47 exhibits can be measured in advance and stored in the storage means of information processing unit 34. For convenience of information processing, the relation between the moving amount in the optical axis direction and the rotation angle of biprism rotary stage 47 may also be stored in a table format.

A guide 41 is a jig for preventing the biprism elevator 40 and wire holder mount 43 from co-rotating integrally without gear transmission and for guiding the movement in the optical axis direction and is fixedly mounted to the biprism rotary stage 47. The wire holder transport mechanism 23, biprism elevator rotation feed through 51 and biprism rotary stage rotation feed through 52 can be moved forwardly and backwardly in the axial direction and during image observation or in the case of needlessness of transportance, movement and rotation of the biprism, they are retreated to the outside of the electron microscope.

Figure 5:
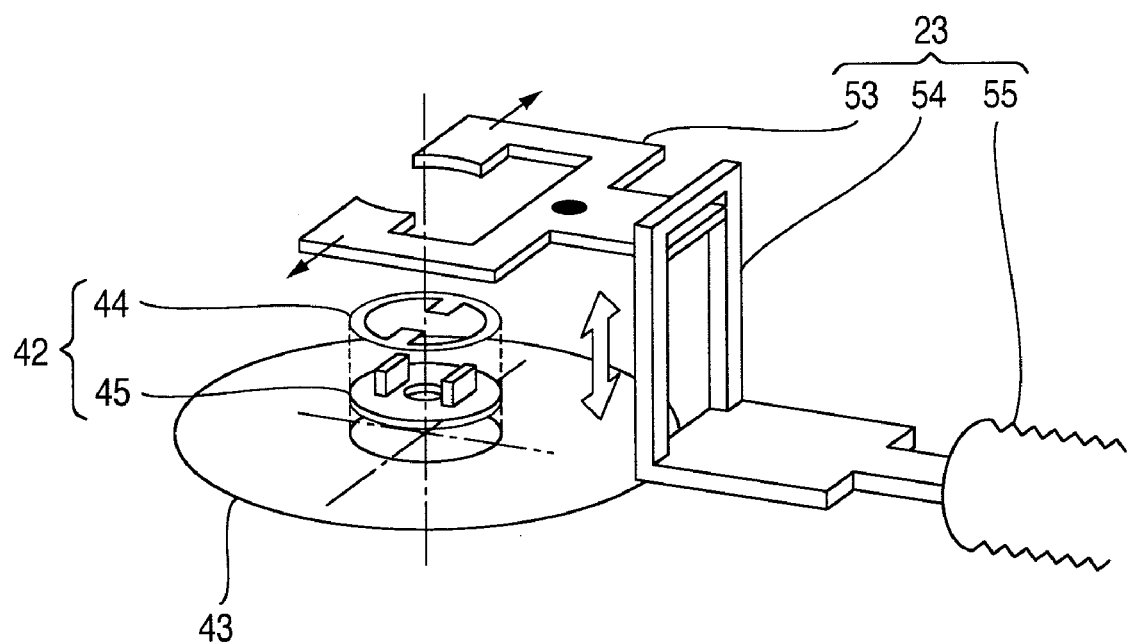
FIG. 5 is a perspective view of a wire holder transport mechanism.

Turning to FIG. 5, a general view of wire holder transport mechanism 23 and the mount/dismount operation of the wire holder 42 are diagrammatically illustrated in perspective view form. The wire holder 42 is comprised of two parts of wire base 44 and wire prism ground electrode 45. When mounting the wire holder 42 to the wire holder mount 43, the wire holder 42 is clamped and held by the chuck 53 and under this condition, the shaft 55 of wire holder transport mechanism 23 is advanced toward the optical axis. The chuck 53 can be moved vertically within a range restricted by the upper and lower ends of guide frame 54. The guide frame 54 is provided with a sensor for position detection, though not illustrated, so that the chuck 53 can constantly be surveilled as to whether to be positioned at any one of the upper and lower ends of the guide frame 54. With the wire holder 42 held by the chuck 53 and with the chuck 53 positioned at the upper end of guide frame 54, the shaft 55 of wire holder transport mechanism 23 is advanced. After arrival of the wire holder 42 on the optical axis has been confirmed, the wire holder 42 along with the chuck 53 is lowered to the lower end of guide frame 54 so as to be inserted in a receptacle of wire holder mount 43. After the insertion, the chuck 53 is undone and returned to the upper end of guide frame 54, followed by retreat of the shaft 55 of wire holder transport mechanism 23. With the wire holder inserted, the wire holder mount 43 and only the biprism ground electrode 45 constituting the wire holder 42 are at the same electrical potential.

Figure 6:
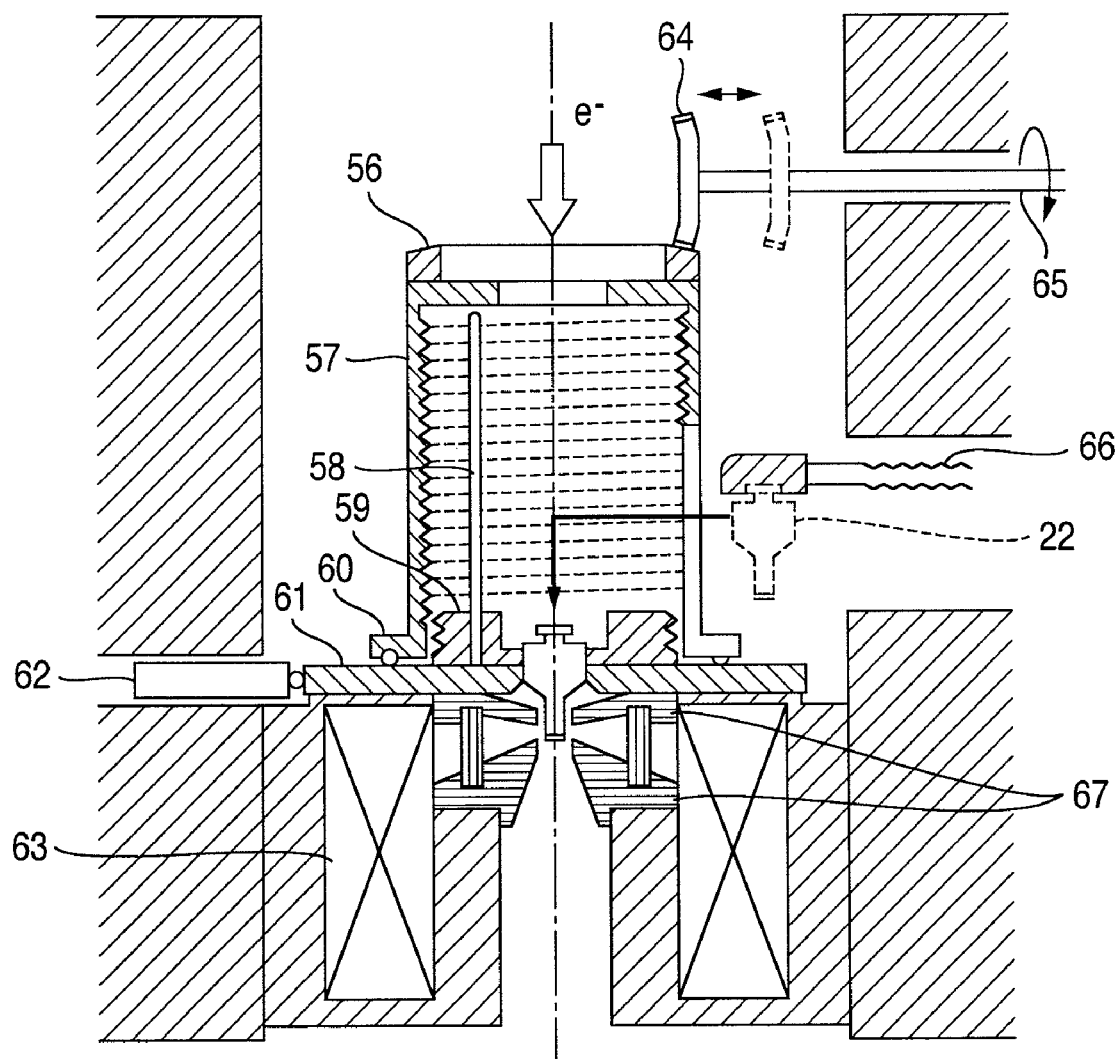
FIG. 6 is a schematic diagram showing in sectional form a specimen holder moving mechanism.

A concrete example of a mechanism for moving the specimen holder 22 in parallel to the optical axis will be described with reference to FIG. 6. A specimen holder elevator 57 takes the form of a cylinder which is partly cut off for mount/dismount of the specimen holder 22. The specimen holder 22 is transported into the column by means of a specimen holder transport mechanism 66 and snuggly fitted in specimen stage 61 and specimen holder mount 59. The specimen holder mount 59 has a disk-shape having its rim threaded and is placed in the center of the specimen stage 61. The specimen holder elevator 57 has its inner wall also threaded, having its upper end attached with an annular gear 56. The gear 56 is so arranged as to be brought into mesh engagement with a bevel gear 64 attached to the fore end of a shaft of specimen holder elevator rotation feed through 65.

As the shaft of specimen holder elevator rotation feed through 65 rotates, the two gears rotate to cause the inner screw of specimen holder elevator 57 to move the specimen holder mount 59, together with the specimen holder 22, in the optical axis direction. In practicing the present invention, the relation between a unit rotation angle of the specimen holder elevator rotation feed through 65 and the moving amounts in the optical direction the specimen holder mount 59 and the specimen holder 22 exhibit, respectively, are measured precedently and stored in the storage means inside the information processing unit 34. Like the electron biprism moving mechanism, the format of data storage is such that the unit rotation angle from a predetermined origin the rotation feed through exhibits, the moving amount from an origin in the optical axis direction the specimen holder mount 59 exhibits and the moving amount from an origin in the optical axis direction the specimen holder 22 exhibits are stored in a table format. The stored data is read out of the storage means as necessary and consulted by the operation means inside the information processing unit 34.

A guide 58 is adapted to prevent the specimen holder elevator 57 and specimen holder mount 59 from co-rotating integrally without gear transmission and to guide the movement in the optical axis direction and is fixedly mounted to the specimen stage 61. By driving actuators 62 provided in two directions in a plane orthogonal to the optical axis, the specimen stage 61 can move the specimen holder to arbitrary positions in the plane. The specimen holder transport mechanism 66 and specimen holder elevator rotation feed through 65 can move in the axial direction and during image observation and needlessness of transport and movement of the specimen holder, they are retreated.

By causing the moving mechanism to keep the specimen holder 22 away from objective lens pole pieces 67 making a magnetic field free space around a specimen and measuring the relative relation between the specimen position and the magnetic field intensity in advance, the specimen can be observed in an arbitrary magnetic field environment. This function gives rise to such a secondary merit that during observation of a magnetic specimen highly susceptible to the influence of a magnetic field, observation can be conducted without impairing magnetic information inside the specimen.

Figure 7:
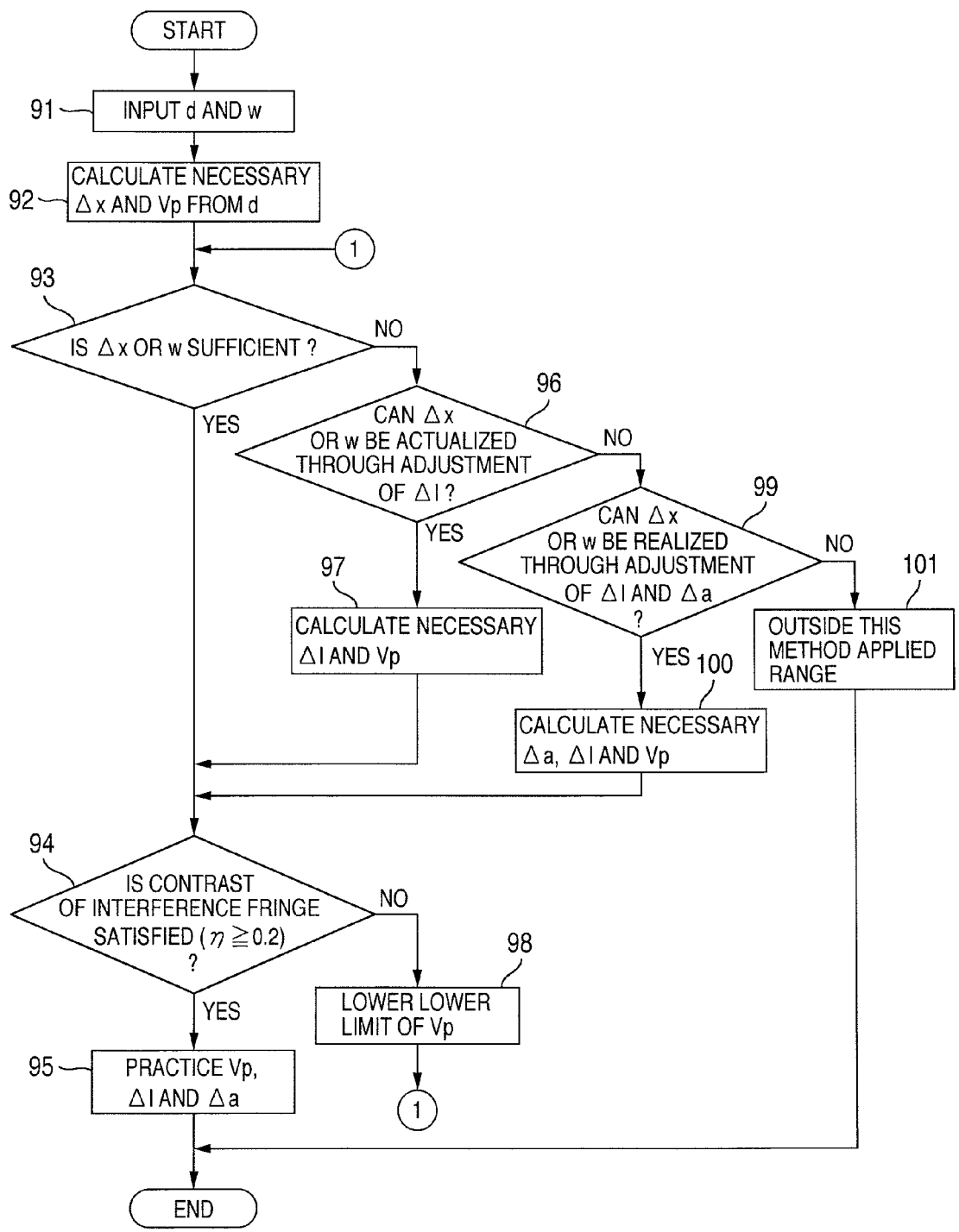
FIG. 7 is a flowchart of operation during condition search in the TEM.

Next, operation of the transmission electron microscope according to the present embodiment will be described. Referring to FIG. 7, there is illustrated a flowchart showing procedures for condition search when holography observation is carried out by using the device shown in FIG. 3. In the following description, all calculation operations are assumed to be executed by means of the information processing unit 34. Also, all operations in individual steps in the flowchart are assumed to be controlled by means of the information processing unit 34. It is further assumed that prior to start of flow, positioning of the electron biprism 6 and specimen holder 22 has ended and the two have already been at predetermined origin positions.

Firstly, in step 91, respective values requested for observation of spatial resolution (d) and area (interference area; w) over which a phase distribution of electron beams desired to be known are inputted through the input device provided for the information processing unit 34. With the respective values d and w inputted, the information processing unit 34 calculates a necessary interference fringe spacing ($\Delta x$). It is herein supposed that reconstruction of a hologram is effected through Fourier transform process and so the necessary interference fringe spacing is set to ⅓ of d.

Next, in step 92, biprism voltage (Vp) necessary for realization of the $\Delta x$ is calculated. The voltage Vp can be calculated pursuant to the following equation (3) by using focal length f of the objective lens, wavelength $\lambda$ of the incident electron beam, deflection angle $\gamma$ per electron biprism unit voltage, interference fringe spacing $\Delta x$ and distance l between the objective lens and the electron biprism. In this phase, the upper limit of the biprism voltage is set to meet a range in which an interference area w generated under the voltage application does not exceed a maximum value $w_{max}$ of interference area.

$$Vp = \frac{1}{\Delta x} \cdot \frac{f \cdot \lambda}{2 \cdot \gamma \cdot |l - f|} \quad (3)$$

Subsequently, in step 93, an examination is executed as to whether the area w when the biprism voltage Vp determined in the preceding step 92 reaches a requested value. The area w can be calculated pursuant to the following equation (4) by using the biprism voltage Vp:

$$w = \frac{2 \cdot \gamma \cdot Vp(b - l)}{M_{obj.}} - 2r_f \cdot \frac{f}{f - l} \quad (4)$$

where b represents distance between the objective lens and the image plane, $M_{obj}$ magnification of the objective lens and $r_f$ radius of the electron biprism.

If "Yes" is determined in the step 93, the program proceeds to the next step 94 to examine contrast ($\eta$) of the interference fringe. Usually, the contrast of interference fringe has a value which is defined pursuant to equation (5) by using maximum value ($I_{max}$) and minimum value ($I_{min}$) of the fringe intensity. This value can be measured from an actually obtained interference fringe but it can also be determined from individual parameters of the electron optical condition, for example, from the ratio between a predicted interference area obtained when Vp determined as a result of calculation is applied and a maximum value of the interference area limited by an divergence angle of the illuminating electron beam. In the present invention, with the aim of further reducing time required for condition search, the $\eta$ will be examined by using the latter method.

$$\eta = \frac{I_{max.} - I_{min.}}{I_{max.} + I_{min.}} \quad (5)$$

Preferably, the $\eta$ is as closely approximate to 1 as possible but in the present embodiment, 0.2 or more is conditioned for examination. This is because with the $\eta$ being 0.2 or more, reconstruction of a hologram can fall into a practically possible range. If this is satisfied, the Vp is applied to the biprism. In case the $\eta$ is insufficient ("No" is determined in the branching step 94 in FIG. 7), the upper limit of the biprism voltage is further lowered and thereafter the program returns to the step 93 to repeat the condition search.

In the event that realization of the $\Delta x$ and w is settled to be impossible through adjustment of the biprism voltage alone ("No" is determined in the branching step 93 in FIG. 7), conditions for realizing the $\Delta x$ and w are searched in step 96 pursuant to equations (6) and (7). In this case, displacement ($\Delta l$) of the electron biprism is taken as a parameter and calculation is carried out with displacement ($\Delta a$) of the specimen position in the equations set to 0. If through recalculation in step 97, biprism voltage value (Vp) and electron biprism displacement ($\Delta l$) which permit realization of the $\Delta x$ and w can be obtained, the program further proceeds to the step 94, in which examination of $\eta$ when these parameters are actually practiced is carried out on the basis of equations (6) and (7). If sufficiency is determined, a command to move the electron biprism is transmitted to the moving mechanism control power supply, thereby practicing the Vp and $\Delta l$ in step 95. In case the $\eta$ is insufficient, the upper limit of biprism voltage is lowered in step 98 and thereafter, the program returns to the step 93 so that observation conditions may be searched within the range of lowered Vp.

If it is determined that Δx and w cannot be realized through adjustment of the biprism voltage (Vp) and electron biprism displacement (Δl) ("No" is issued in the branching step 96 in FIG. 7), both the displacement (Δl) of electron biprism position and the displacement (Δa) of specimen position are taken as parameters and conditions for realizing the Δx and w are searched in step 99 pursuant to equations (6) and (7) as in the precedence. It should be noticed that the displacement Δa differs from the displacement Δl in that as the former displacement proceeds, the magnification of the objective lens changes pursuant to equation (8).

$$w = \frac{2 \cdot \gamma \cdot Vp\{b - (1 + \Delta l)\}}{M_{obj}|_{a=a_O+\Delta a}} - 2r_j \cdot \frac{f|_{a=a_O+\Delta a}}{f|_{a=a_O+\Delta a} - (l + \Delta l)} \quad (6)$$

$$\Delta x = \frac{f|_{a=a_O+\Delta a} \cdot \lambda}{2 \cdot \gamma \cdot Vp\{f|_{a=a_O+\Delta a} - (l + \Delta l)\}} \quad (7)$$

$$M_{obj}|_{a=a_O+\Delta a} = \frac{b}{a + \Delta a} \quad (8)$$

where f represents focal length of the objective lens, $M_{obj}$ magnification of the objective lens, Δl electron biprism displacement, $a_0$ position of the specimen surface in default condition and Δa specimen position displacement. From the viewpoint of physics, the Δl and Δa correspond to amounts of movement in the optical axis direction of the biprism and the specimen surface, respectively, and both of them are 0 in default condition.

When the Vp, Δl and Δa satisfying the request can be obtained through the calculation in step 100, the program further proceeds to the step 94, in which the η when these parameters are practiced is examined on the basis of equations (6) and (7). When the result of examination determines that the obtained η is sufficient, the table stored in the storage means inside the information processing unit 34 is read out and a rotation amount of biprism elevator rotation feed through 51 corresponding to the calculated Δl and a rotation amount of specimen holder elevator rotation feed through 65 corresponding to the calculated Δa are calculated. The thus calculated rotation amounts are transmitted to the moving mechanism controller 40 and so a movement by Δl and a movement by Δa are executed. Similarly, the value of Vp is transferred to the controller 28, which in turn transfers this value to the biprism power supply 69, thus starting applying a voltage of Vp to the electron biprism 6 (step 95).

In this phase, the control sequence is so constituted as to execute moving operation by Δl after moving operation by Δa. This is because as described previously, a change in Δa is accompanied by a change in focal length which provides an exact focus of the objective lens and therefore the focal length of the objective lens is adjusted immediately after the execution of Δa moving operation to permit work to be done while watching an exact focus image.

As the magnification ($M_{obj}$) of objective lens changes with execution of the Δa movement, image magnification ($M_{Total}$) of the whole of electron microscope also changes. Therefore, during image observation, the function to sequentially calculate the final image magnification from Δa and the equation (8) and equation (9) and to display results of the calculation on the display of information processing unit 34 is provided, thereby ameliorating the easy-to-handle capability by the user.

$$M_{Total}|_{a=a_O+\Delta a} = M_{Default} \cdot \frac{M_{obj}|_{a=a_O+\Delta a}}{M_{obj}} \quad (9)$$

where $M_{Default}$ and $a_0$ represent the final magnification factor in default condition and the position on specimen surface in default condition, respectively. Further, $M_{obj}$ and Δa representing the magnification of objective lens and the specimen position displacement, respectively, are both 0 in default condition.

Figure 8:
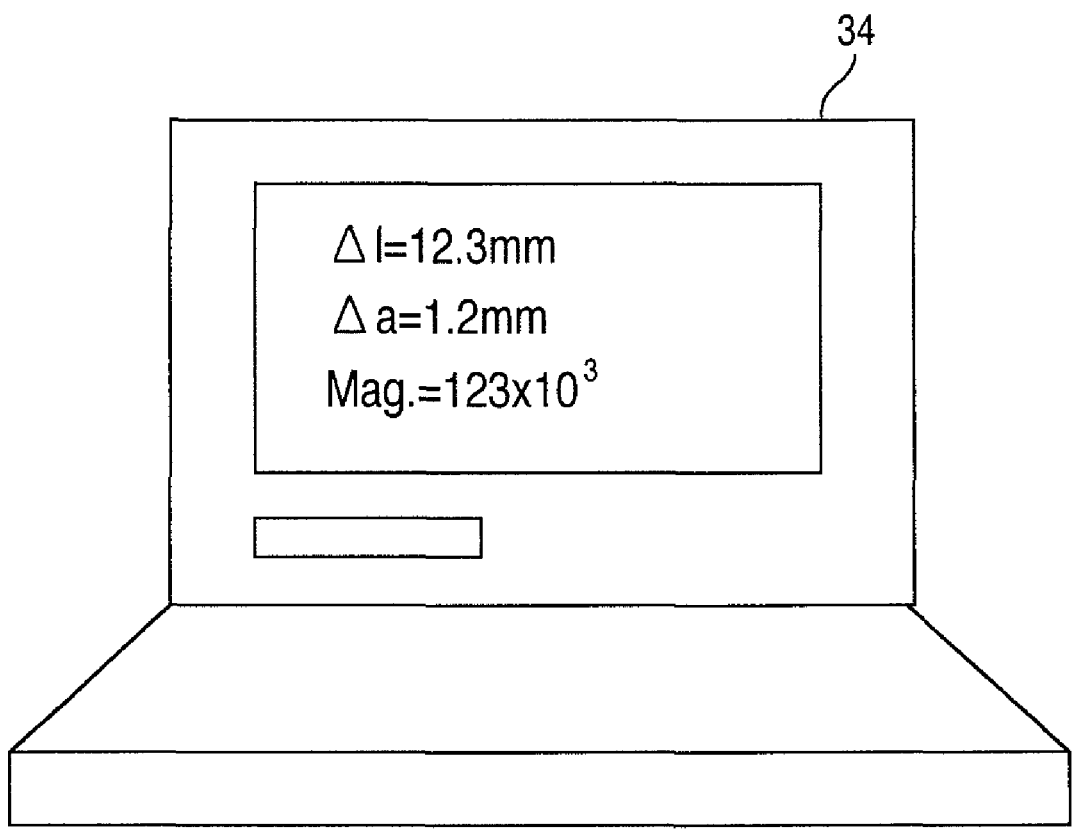
FIG. 8 is a diagram showing an example of magnification display in an information processing unit.

The final magnification calculated from the Δl and Δa is displayed on the display as illustrated in FIG. 8. It will be appreciated that if realization of the Δx and w within the variable ranges of Vp, Δl and Δa is determined to be impossible ("No" is conditioned for branching step 101 in FIG. 7), the requested condition is deemed as being outside the applicable range of the present invention and the work ends.

With the construction described previously, in the electron microscope incorporating the holography observation function, work or operation including adjustment of positions of the electron biprism and specimen and adjustment of the application voltage to the electron biprism can be automated and an device highly easy to operate can be materialized.

In the present embodiment, a change in image magnification due to a displacement (Δa) of specimen position is considered as bringing a cause of confusion on unskilled operators and so, the sequence is provided in which in the case of "No" determined in the branching step 93 in FIG. 7, the condition search based on the electron biprism displacement (Δl) is first executed. This is because a displacement of Δl alone does not affect an image in observation and only a change in interference area or interference fringe spacing takes place. This order of operation is not always important and practically, it is supposed that after displacements of specimen position are covered, the electron biprism displacement is searched or the condition is searched by using only one type of the displacements.

Embodiment 2

Figure 9:
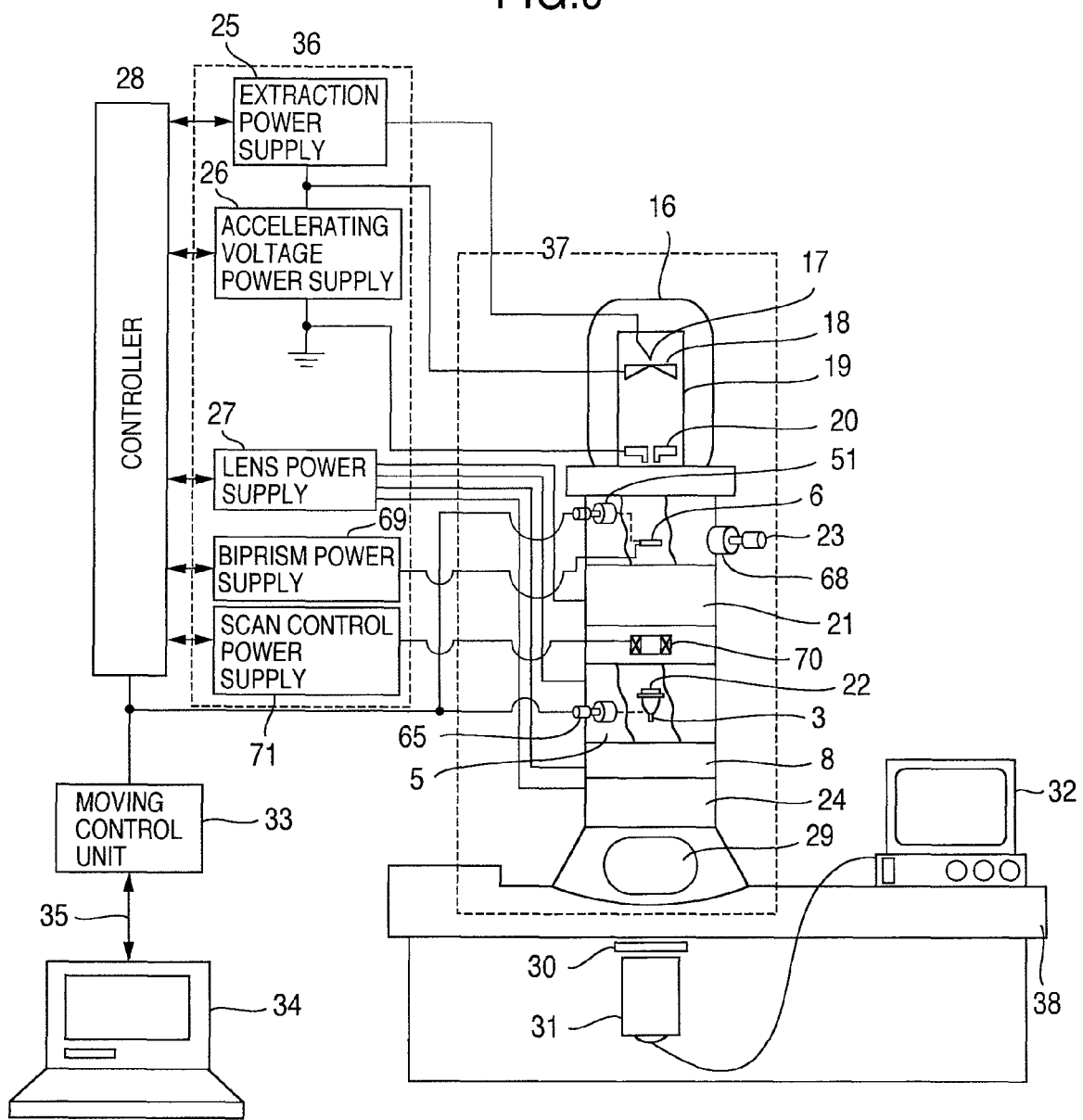
FIG. 9 is an device external view of a scanning transmission electron microscope to which the invention is applied.

In the present embodiment, an example will be described in which the present invention is applied to a scanning transmission electron microscope (STEM). The device construction of the STEM incorporating the automatic adjustment function according to the present invention is schematically diagrammatically illustrated in FIG. 9. In the case of the STEM, a deflection coil 70 for scanning a focused electron beam formed by the objective lens 5 on the specimen surface and a scan control power supply 71 are built in. Further, the position of electron biprism 6 differs from that in the TEM so as to be above an illuminating lens 21 but except for the above, constituent elements are substantially the same as those of the device shown in FIG. 3.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An electron microscope applied device comprising:
   an electron gun for irradiating an electron beam on a specimen;
   a specimen holder for mounting the specimen;
   an electron biprism arranged at a position through which the electron beam having transmitted through said specimen passes;
   an imaging unit for imaging an interference fringe of components of the electron beam passed through said electron biprism or a transmission electron image of said specimen; and
   an information processing unit having at least an input device
   wherein said information processing unit calculates an interval of the interference fringe based on values of a spatial resolution and an interference area inputted via said input device,
   and calculates amounts of movements of said electron biprism in an optical axis of the electron beam and/or amounts of movements of said specimen holder in an optical axis of the electron beam, so as to comply with information of the interference area inputted and the interval of the interferences fringe calculated.

2. An electron microscope applied devices according to claim 1, wherein said information processing unit is configured to calculate amounts of movement of said electron biprism on the basis of a spatial resolution based on an interval of the interference fringe and an area in which said interference fringe is formed.

3. An electron microscope applied devices according to claim 1,
   wherein said information processing unit comprises a unit for calculating a change in magnification of the objective lens due to a change in position of said specimen holder from the change amount of specimen holder position, and
   wherein said information processing unit further comprises a display for displaying magnifications of the transmission electron image according to calculated magnification changes.

4. An electron microscope applied devices according to claim 2, further comprising:
   a unit for moving the specimen holder position, adjusting the focal length of the objective lens such that the image of the objective lens becomes an exact focus image at a specimen position after the movement, and
   wherein operations of adjusting positions of the electron biprism and the specimen holder are executed in such a sequence that after adjustment of the focal length of said objective lens, the position of said electron biprism is moved.

5. An electron microscope applied devices according to claim 1, wherein said electron biprism includes a wire irradiated with the electron beam, a wire holder for holding the wire and a wire holder mount on which said wire holder is mounted, said device further comprising a wire holder transport unit for taking in and out said wire holder to and from said electron microscope column and a feed through formed in the wall of said electron microscope column to permit the introduction of said wire holder transport unit.

6. An electron microscope applied devices according to claim 1, wherein said position adjustment unit includes:
   an electron biprism elevator for internally accommodating said electron biprism; and
   a unit for vertically moving said electron biprism inside said electron biprism elevator.

7. An electron microscope applied devices according to claim 6, wherein said electron biprism includes a wire irradiated with the electron beam, a wire holder for holding the wire and a wire holder mount on which said wire holder is mounted, the inner wall of said electron biprism elevator is threaded with a screw, said wire holder mount has its rim threaded with a screw in mesh with the screw thread said elevator has, a stage for mounting said wire holder and wire holder mount and a rotation feed through for driving rotation of said stage.

8. An electron microscope applied devices according to claim 7, wherein the number of revolutions of said rotation feed through is controlled by said information processing unit.

9. An electron microscope applied devices according to claim 8 further comprising a storage unit for storing a unit rotation angle of said rotation feed through and amounts of movement of said electron biprism.

10. An electron microscope applied devices according to claim 1 further comprising a first unit for adjusting the position which changes a position of said electron biprism in the optical axis of the electron beam, wherein said first unit for adjusting the position moves said electron biprism in the optical axis of the electron beam based on the amounts of movements of said electron biprism in the optical axis of the electron beam calculated in said information processing unit.

11. An electron microscope applied devices according to claim 1 further comprising a second unit for adjusting the position which changes a position of said specimen holder in the optical axis of the electron bean, wherein said second unit for adjusting the position moves said specimen holder in the optical axis of the electron beam based on the amounts of movements of said specimen holder in the optical axis of the electron beam calculated in said information processing unit.

* * * * *